United States Patent
Okuno et al.

(10) Patent No.: US 6,287,903 B1
(45) Date of Patent: Sep. 11, 2001

(54) STRUCTURE AND METHOD FOR A LARGE-PERMITTIVITY DIELECTRIC USING A GERMANIUM LAYER

(75) Inventors: Yasutoshi Okuno, Richardson; Scott R. Summerfelt, Garland, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/217,337

(22) Filed: Dec. 21, 1998

(51) Int. Cl.[7] .................. H01L 21/336; H01L 21/8234

(52) U.S. Cl. ................. 438/197; 438/142; 438/211

(58) Field of Search .................... 438/197, 142, 438/211, 212, 270, 283

(56) References Cited

U.S. PATENT DOCUMENTS

| | | |
|---|---|---|
| 5,134,447 | 7/1992 | Ng et al. . |
| 5,168,072 | 12/1992 | Moslehi . |
| 5,266,510 | 11/1993 | Lee . |
| 5,296,386 | 3/1994 | Aronowitz et al. . |
| 5,296,387 | 3/1994 | Aronowitz et al. . |
| 5,326,721 | * 7/1994 | Summerfelt . |
| 5,437,734 | 8/1995 | Matsushita et al. ............ 136/249 |
| 5,466,949 | 11/1995 | Okuno . |
| 5,500,391 | 3/1996 | Bevk et al. . |
| 5,536,667 | 7/1996 | Cho . |
| 5,602,403 | * 2/1997 | Aklufi . |
| 5,644,152 | 7/1997 | Rostoker et al. . |

FOREIGN PATENT DOCUMENTS

| | | |
|---|---|---|
| 0 568 064 A2 | 11/1993 | (EP) . |
| 0 568 065 A2 | 11/1993 | (EP) . |
| 0 750 350 A2 | 12/1996 | (EP) . |

OTHER PUBLICATIONS

D. Fathy et al., "Formation of Epitaxial Layers of Ge on Si Substrates by Ge Implantation and Oxidation," *American Institute of Physics*, pp. 1337–1339, 1987.

O.W. Holland et al., "Noval Oxidation Process . . . Ge[+]–Implanted Si and Its Effect on Oxidation Kinetics," *American Institute of Physics*, pp. 520–522, 1987.

(List continued on next page.)

*Primary Examiner*—Kevin M. Picardat
*Assistant Examiner*—D. M. Collins
(74) *Attorney, Agent, or Firm*—David Denker; Wade James Brady, III; Frederick J. Telecky, Jr.

(57) ABSTRACT

A structure for, and method of forming, a metal-insulator-semiconductor field-effect transistor in an integrated circuit is disclosed. The disclosed method comprises forming a germanium layer 52 on a semiconductor substrate (e.g. silicon 20), depositing a large-permittivity gate dielectric (e.g. tantalum pentoxide 56) on the germanium layer, and forming a gate electrode (e.g., titanium nitride 60) on the gate dielectric. The method may comprise forming source and drain regions 64 in the substrate on either side of the gate dielectric. The germanium layer, which is preferably epitaxially grown, generally prevents formation of a low dielectric constant layer between the gate dielectric and the semiconductor substrate. The disclosed structure comprises a germanium layer 52 disposed on a semiconductor substrate (e.g. silicon 20), a large-permittivity gate dielectric (e.g. tantalum pentoxide 56) disposed on the germanium layer, and a gate electrode (e.g., titanium nitride 60) disposed on the gate dielectric. The structure may comprise source and drain regions 64 disposed in the substrate on either side of the gate dielectric. A $Ge_xSi_{1-x}$ buffer layer 58 may be formed between the semiconductor substrate and the germanium layer, with x transitioning from about 0 near the substrate to about 1 near the germanium layer. The large-permittivity gate dielectric may be either a moderate-dielectric constant oxide or a high-dielectric constant oxide.

20 Claims, 3 Drawing Sheets

OTHER PUBLICATIONS

Deepak K. Nayak et al., "Rapid Isothermal Processing of Strained GeSi Layers," *IEEE*, vol. 39, No. 1, pp. 56–63, Jan. 1992.

K, Prabhakran et al., "In Situ Oxidation of a Thin Layer of Ge on Si (001): Observation of Geo to $SiO_2$ Transition," *American Institute of Physics*, pp. 864–866, 1993.

Mau–Tsu Tang et al., "Roughness of the Silicon (001)/$SiO_2$ Interface," *American Institute of Physics*, pp. 3144–3146, 1993.

M.C. Ozturk et al., "Rapid Thermal Chemical Vapor Deposition of Germanium on Silicon and Silicon Dioxide and New Applications of Ge in ULSI Technologies," *Journal of Electronic Materials*, vol. 19, No. 10, pp. 1129–1134, 1990.

G. Lucovsky et al., "Low Temperature Plasma–Assisted Oxidation and Thin–film Deposition Processes for forming Device–Quality $SiO_2$/Si Composite Dielectric–$SiO_2$/Si Heterostructures," *Thin Solid Films*, 220, pp. 38–44, 1992.

Jacabs et al., "Effect of a Ge Barrier on the Microstructure of $BaTiO_3$ Deposited on Silicon by Pulsed Laser Ablation", Mat. Res. Soc. Symp. Proc., vol. 285, 1993, Materials Research society, pp. 379–384.

* cited by examiner

STRUCTURE AND METHOD FOR A LARGE-PERMITTIVITY DIELECTRIC USING A GERMANIUM LAYER

FIELD OF THE INVENTION

This invention generally pertains to the integration of dielectrics with integrated circuits, and more particularly to reaction barriers between large-permittivity dielectrics and an underlying semiconductor layer.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits that can accomplish more functions in less time in a smaller package while consuming less power.

Generally, an arrangement of layers with an oxide between a conducting layer and a semiconductor is usable as a portion of many of the structures used in semiconductor circuitry, such as capacitors, MOS transistors, pixels for light detecting arrays, and electrooptic applications. $SiO_2$ is the primary oxide used in semiconductors today. The integration of non-$SiO_2$ based oxides directly or indirectly on Si is difficult because of the strong reactivity of Si with oxygen. The deposition of non-$SiO_2$ oxides on Si has generally resulted in the formation of a $SiO_2$ or silicate layer at the Si // oxide interface. This layer is generally amorphous and has a low dielectric constant. These properties degrade the usefulness of non-$SiO_2$ based oxides with Si.

High-dielectric constant (HDC) oxides (e.g. a ferroelectric oxide) can have a large dielectric constant, a large spontaneous polarization, and large electrooptic properties. Ferroelectrics with a large dielectric constant can be used to form high density capacitors but can not deposited directly on Si because of the reaction of Si to form a low dielectric constant layer. Such capacitor dielectrics have been deposited on "inert" metals such as Pt, but even Pt or Pd must be separated from the Si with one or more conductive buffer layers. Putting the high dielectric material on a conductive layer (which is either directly on the semiconductor or on an insulating layer which is on the semiconductor) has not solved the problem. Of the conductor or semiconductor materials previously suggested for use next to high dielectric materials in semiconductor circuitry, none of these materials provides for the epitaxial growth of high dielectric materials on a conductor or semiconductor. Further, the prior art materials generally either form a silicide which allows the diffusion of silicon into the high dielectric materials, or react with silicon or react with the high dielectric oxide to form low dielectric constant insulators.

The large spontaneous polarization of ferroelectrics when integrated directly on a semiconductor can also be used to form a non-volatile, non-destructive readout, field effect memory. This has been successfully done with non-oxide ferroelectrics such as $(Ba,Mg)F_2$ but not so successfully with oxide ferroelectrics because the formation of the low dielectric constant $SiO_2$ layer acts to reduce the field within the oxide. The oxide can also either poison the Si device or create so many interface traps that the device will not operate properly. Ferroelectrics also have interesting electrooptic applications where epitaxial films are preferred in order to reduce loss due to scattering from grain boundaries and to align the oxide in order to maximize its anisotropic properties. The epitaxial growth on Si or GaAs substrates has previously been accomplished by first growing a very stable oxide or fluoride on the Si or GaAs as a buffer layer prior to growing another type of oxide. The integration of oxides on GaAs is even harder than Si because the GaAs is unstable in $O_2$ at the normal growth temperatures of 450° C.–700° C.

In another integrated circuit area, prior art devices use $SiO_2$ based films with thicknesses of 5 nm or more for the gate dielectric in conventional MOS (metal-oxide-semiconductor) circuits. For future small geometry devices the thickness of the gate dielectric is projected to be less than 4 nm, then less than 3 nm, and eventually less than 2 nm. One reason for this is that the current drive in a MOS transistor is directly proportional to the gate capacitance. Because capacitance scales inversely with thickness, higher current drive requires continual reductions in the thickness for conventional dielectrics. $SiO_2$ gate dielectrics in this thickness region, however. pose considerable challenges, such as breakdown and tunneling problems, as well as manufacturing process control problems. For example, direct tunneling through the $SiO_2$ may occur, although the effect of tunneling current on device performance may not preclude operation. Because the tunnel current depends exponentially on the dielectric thickness, small variations in process control may result in large variations in the tunnel current, possibly leading to localized reliability problems. In addition, $SiO_2$ at these reduced thicknesses provides very little barrier to diffusion. Thus the diffusion of boron from doped polysilicon gates, for example. would result in an increasingly difficult problem as geometries shrink.

SUMMARY OF THE INVENTION

A Ge buffer layer directly or indirectly on Si oxidizes much less readily than Si, and can be used to prevent or minimize the formation of a low dielectric constant layer. An epitaxial Ge layer on Si provides a good buffer layer which is compatible with Si and also many oxides. Unlike other buffer layers, Ge is a semiconductor (it can also be doped to provide a reasonably highly conductive layer) and is compatible with Si process technology. The epitaxial growth of Ge on top of a large-permittivity oxide is also much easier than Si which makes it possible to form three dimensional epitaxial structures. The Ge buffer layer can be epitaxially grown on the Si substrate allowing the large-permittivity oxide to be epitaxially grown on the Ge and hence epitaxially aligned to the Si substrate. The epitaxial Ge layer allows ferroelectrics to be directly grown on Si wafers to form non-volatile non-destructive read out memory cells. The Ge buffer layer will also increase the capacitance of large-permittivity oxide films compared to films grown directly on Si. A Ge buffer layer on the Si or GaAs substrate allows many more oxides to be epitaxially grown on it because of the much smaller chemical reactivity of Ge with oxygen compared to Si or GaAs with oxygen.

Generally the prior art conductive materials suggested for interfacing with large-permittivity oxides in semiconductor circuitry either have reacted with the large-permittivity oxides or with the semiconductor and/or have not provided a diffusion barrier between the large-permittivity oxides and semiconductor material. As noted, the integration of oxides on GaAs is even harder than on Si because GaAs is unstable in $O_2$ at the normal growth temperatures of high-dielectric constant oxides (450° C.–700° C.), and at the growth temperatures of some moderate-dielectric constant oxides. An epitaxial Ge buffer layer solves this problem and simplifies the integration of large-permittivity oxides on GaAs for the same applications as listed above.

A structure for, and method of forming, a memory cell in an integrated circuit is disclosed. This is a method for fabricating a structure useful in semiconductor circuitry comprising growing a germanium layer on a non-germanium semiconductor substrate, and depositing a high-dielectric constant oxide on the germanium layer. Preferably, the germanium layer is epitaxially grown on the semiconductor substrate. This is also a structure useful in semiconductor circuitry comprising a semiconductor substrate, a germanium layer on the semiconductor substrate, and a high-dielectric constant oxide on the germanium layer. Preferably the germanium layer is single-crystal. Preferably, the substrate is silicon and the germanium layer is less than about 1 nm thick, or the substrate is gallium arsenide (in which case the thickness of the germanium layer is not as important). A second germanium layer may be grown on top of the high-dielectric constant oxide, and a conducting layer (any layer may be epitaxial if the layer below it is single crystal) may be grown on the second germanium layer. Preferably the high-dielectric constant oxide is a titanate, such as barium strontium titanate. When the high-dielectric constant oxide is a lead-containing titanate, a buffer layer of non-lead-containing titanate is preferably utilized between the germanium layer and the lead-containing titanate. Preferably the high-dielectric constant oxide is a ferroelectric oxide.

A structure for, and method of forming, a MIS (metal-insulator-semiconductor) field-effect transistor (FET) in an integrated circuit is also disclosed. The disclosed method comprises forming a germanium layer on a semiconductor substrate, depositing a large-permittivity gate dielectric on the germanium layer, and forming a gate electrode on the gate dielectric. The method may comprise forming source and drain regions in the substrate on either side of the gate dielectric. The germanium layer, which is preferably epitaxially grown, generally prevents formation of a low dielectric constant layer between the gate dielectric and the semiconductor substrate. The disclosed structure comprises a germanium layer disposed on a semiconductor substrate, a large-permittivity gate dielectric disposed on the germanium layer, and a gate electrode disposed on the gate dielectric. The structure may comprise source and drain regions disposed in the substrate on either side of the gate dielectric. A $Ge_xSi_{1-x}$ buffer layer may be formed between the semiconductor substrate and the germanium layer, with x transitioning from about 0 near the substrate to about 1 near the germanium layer. The large-permittivity gate dielectric may be either a moderate-dielectric constant oxide or a high-dielectric constant oxide. Some suitable gate dielectric materials include the oxides of Al, Ti, Zr, Hf, Ce, Sc, Y, La, Ta and Nb, and combinations thereof. The gate dielectric material may be doped with another material. for example Ti-doped tantalum pentoxide, in order to enhance the dielectric constant. The disclosed methods and structures will also likely apply to some of the new large-permittivity dielectrics currently being developed, including large-permittivity organic dielectrics.

BRIEF DESCRIPTION OF THE DRAWINGS

Further features of the present invention will become apparent from a description of the fabrication process and structure thereof, taken in conjunction with the accompanying drawings. in which.

DETAILED DESCRIPTION OF THE PREFERRED EMBODIMENTS

As noted, the growth of large-permittivity oxides on Si generally results in the oxidation of the Si and the formation of $SiO_2$ or a silicate layer. Further, this $SiO_2$ layer prevents the epitaxy of the deposited oxide and has a low dielectric constant, and the integration of ferroelectrics and other large-permittivity materials directly on Si is degraded by the formation of the low dielectric constant $SiO_2$ layer. Also as noted, putting the high dielectric material on a conductive layer (which is either directly on the semiconductor or on an insulating layer which is on the semiconductor) has not solved the problem.

A Ge buffer layer between non-$SiO_2$ oxides and Si reduces the reactivity of the Si surface and in general enhances the epitaxy and at least reduces the reaction layer between the deposited oxide and the Si substrate. The epitaxial growth of Ge on Si is compatible with current Si process technology. One difficulty with Ge on Si the critical thickness. Generally, a 4% lattice mismatch results in some misfit dislocation in Ge films thicker than 1–1.5 nm on silicon. Therefore, on silicon the Ge layer is preferably very thin to avoid the misfit dislocations, however a thicker layer may be used for some devices if the dislocations are not detrimental to the device performance. In still other embodiments, polycrystalline Ge may be formed over silicon dioxide or polycrystalline Si (thus using the Ge as a chemical buffer layer between a deposited oxide and the Si substrate).

Depending on the application the choice of materials may be very different. For example. for large density capacitors, currently the best linear dielectric appears to be $(Ba_{1-x},Sr_x)TiO_3$ (BST). $BaTiO_3$ (BT) or $SrTiO_3$ (ST) when deposited directly on Si form a low dielectric constant layer, because BT and ST are not thermodynamically stable next to Si. Ge, however, has a much smaller free energy of oxidation and BT and ST are thermodynamically stable next to Ge. It is also possible to deposit BT and ST in a $H_2+O_2$ gas mixture such that Ge is stable and also BT or ST is stable, while $GeO_2$ is not stable. Not all oxides, however, are stable next to Ge. For example, all ferroelectrics containing Pb, such as Pb(Ti,Zr)O (PZT) are much less stable next to Ge (since PbO is not stable). A thin layer of $SrTiO_3$ or other stable ferroelectric can, however, be used as a buffer layer between the Pb containing ferroelectric and the Ge coated Si substrate. The $SrTiO_3$ not only acts as a chemical barrier, but also nucleates the desired perovskite structure (instead of the undesirable pyrochlore structure).

An epitaxial Ge buffer layer was used in experiments on a (100) Si substrate to deposit epitaxial BST. Without the Ge buffer layer, the BST was randomly oriented polycrystalline. With the Ge buffer layer, most of the BST has the following orientation relationship: (110) BST ∥ (100) Si. This showed that the Ge buffer layer prevented the formation of a low dielectric layer at the interface prior to epitaxy, since that layer would have prevented epitaxy.

The deposition of a ferroelectric directly on a semiconductor has been used by others to create a non-volatile nondestructive readout memory. This device is basically a MOS transistor where the $SiO_2$ has been replaced with a ferroelectric (metal-ferroelectric-semiconductor or MFS). One memory cell consists of a MFS transistor and a standard MOS transistor. This type of memory has many advantages including very fast read/write as well having nearly the same density as a standard DRAM cell. The remnant polarization in the ferroelectric can be used to induce a field into the semiconductor and hence the device is non-volatile and non-destructive. This device has been successfully made by others using a $(Ba,Mg)F_2$ ferroelectric layer epitaxially grown by MBE on the Si substrate. Oxide perovskites such as PZT have also been studied for non-volatile memories but these materials can not be deposited directly on Si without reacting with the Si. A Ge buffer layer will allow many stable ferroelectrics, such as $BaTiO_3$, to be used in a RAM. A second buffer layer of $SrTiO_3$ or some other stable ferroelectric should allow even most chemically reactive ferroelectric oxides to be used to try to form a RAM. The Ge buffer layer would also allow this type of memory to be fabricated on GaAs and other III–V compounds in addition to Si. It also might be possible to fabricate a thin-film MFS transistor by depositing the Ge on top of the ferroelectric. The ferroelectric might be epitaxial on the GaAs or Si substrate or it might be polycrystalline. The compatibility of Ge with a stable ferroelectric buffer layer allows this structure to be manufactured.

Figure 1:
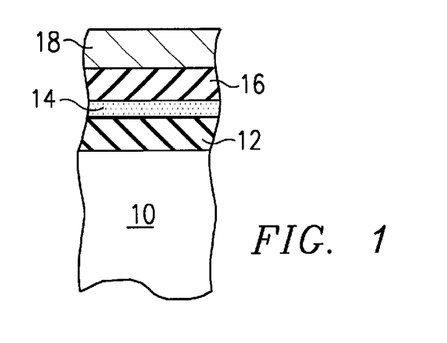
FIG. 1 shows a cross-section of one embodiment of a multi-layer structure using a polycrystalline Ge buffer layer.

In FIG. 1 there is shown one preferred embodiment (in FIGS. 1–4, an arrangement of layers is shown which is usable as a portion of many structures used in semiconductor circuitry, such as capacitors, MOS transistors, pixels for light detecting arrays, and electrooptic applications). FIG. 1 shows a semiconductor substrate 10, on which an silicon dioxide insulating layer 12 has been deposited, with a doped polycrystalline germanium layer 14 over the silicon dioxide 12 (the germanium can be highly doped to provide a highly conductive layer, and the germanium is polycrystalline, as it overlies an amorphous silicon dioxide layer). A ferroelectric barium strontium titanate layer 16 is deposited on the germanium layer, and a titanium-tungsten layer 18 is deposited atop the barium strontium titanate 16. As noted, such an arrangement of layers is usable in many semiconductor structures and the ferroelectric or high dielectric properties of the barium strontium titanate provides advantageous properties over most other insulating materials.

Figure 2:
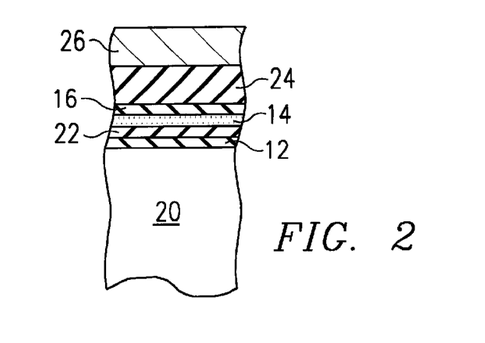
FIG. 2 shows a cross-section of an alternate embodiment of a multi-layer structure using a polycrystalline Ge buffer layer.

FIG. 2 shows an alternate embodiment, again in which the germanium (and thus all layers above it) is polycrystalline. A silicon dioxide layer 12 is on a silicon substrate 20 with a silicon nitride layer 22 atop the silicon dioxide 12. A polycrystalline germanium layer 14, a barium strontium titanate layer 16 and a lead zirconium titanate layer 24 and a titanium nitride layer 26 are successively added atop the silicon nitride layer. In this case, the barium strontium titanate 16 generally acts as a buffer layer to prevent reaction between the lead of the lead zirconium titanate 24 and the germanium 14.

Figures 3, 4, 5:
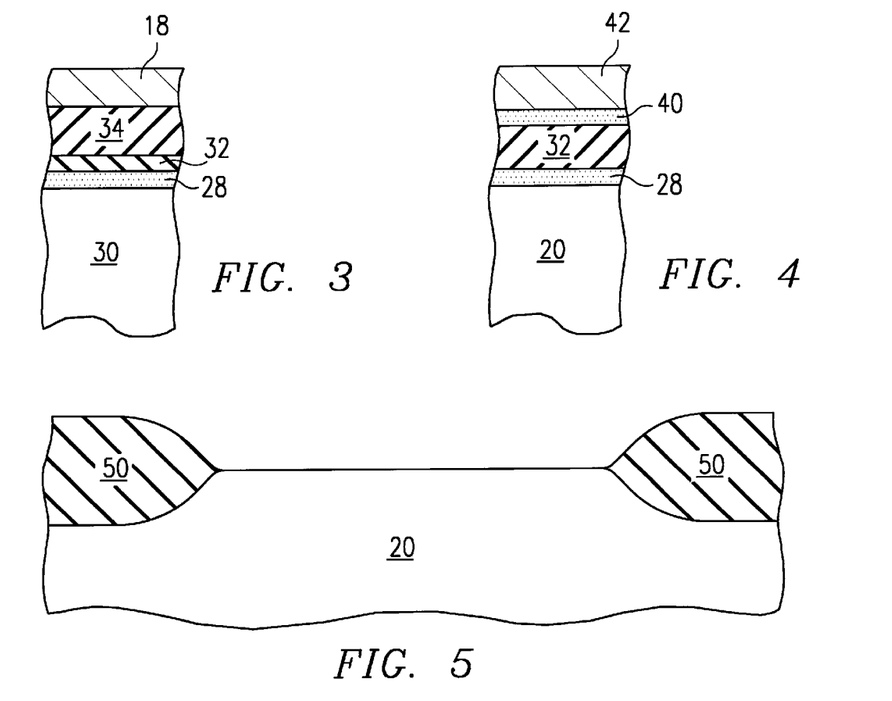
FIG. 3 shows a cross-section of an embodiment of a multi-layer structure using an epitaxial Ge buffer layer.
FIG. 4 shows a cross-section of an alternate embodiment of a multi-layer structure using an epitaxial Ge buffer layer.
FIGS. 5–8 show cross-sections of the progressive steps in the fabrication of a field-effect transistor using an epitaxial Ge buffer layer.

FIG. 3 illustrates the use of epitaxial germanium. As the single crystal germanium 28 can be epitaxially grown on the gallium arsenide substrate 30, with a good lattice match, good crystal quality can be obtained both in the germanium 28, and the epitaxial barium strontium titanate layer 32 and on into the $(Pb,Mg)NbO_3$ layer 34. The top electrode 18 can be titanium-tungsten (as in the preceding figures, annealing of the ferroelectric layer or layers can be accomplished before deposition of the top electrode, and thus reactions between the ferroelectric and a material such as titanium-tungsten can be used as reaction with the ferroelectric is minimized due to the low temperature processing of the remaining steps). It should be noted that an epitaxial structure utilizing single crystal germanium allows the germanium to be utilized as a part of a transistor, for example. Thus, single crystal germanium is useful, even if the ferroelectric material is grown under conditions which provide a polycrystalline ferroelectric.

FIG. 4 shows an alternate structure using epitaxial germanium. Here the silicon substrate 20 is covered by a germanium epitaxial layer 28, which is in turn covered by a barium strontium titanate epitaxial layer 32. A second germanium layer 40 is over the barium strontium titanate 32, and an aluminum top electrode 42 is over the second germanium layer 40. The use of a second germanium layer allows the usage of a wider variety of conductors for the top electrode and allows higher temperature processing during and after the deposition of the top electrode, as the germanium generally prevents reaction between the top electrode material and the ferroelectric material.

Figure 6:
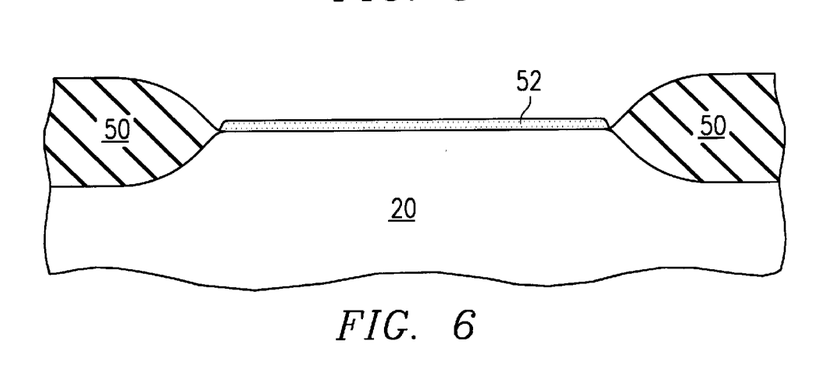

FIG. 5–13 depict alternate embodiments (at various stages of completion) of the present invention in which a germanium layer is used as a reactive barrier between a semiconductor substrate and a large-permittivity gate dielectric in a MIS field-effect transistor (MISFET). In FIG. 5, a standard $SiO_2$ field oxide 50 is formed on the surface of silicon substrate 20, leaving a portion of the substrate 20 exposed for the formation of the MISFET. In FIG. 6, a 1.5 nm (about 5 monolayers) epitaxial germanium layer 52 is grown on the exposed surface of silicon substrate 20. Molecular beam epitaxy is used (other processes may be used, such as MOVPE or MOCVD) with a germanium source as a precursor to selectively grow the layer at about 600° C. As shown in FIG. 5, germanium layer 52 is selectively grown only on the exposed surface of silicon substrate 20, and not on field oxide 50.

Figure 7:
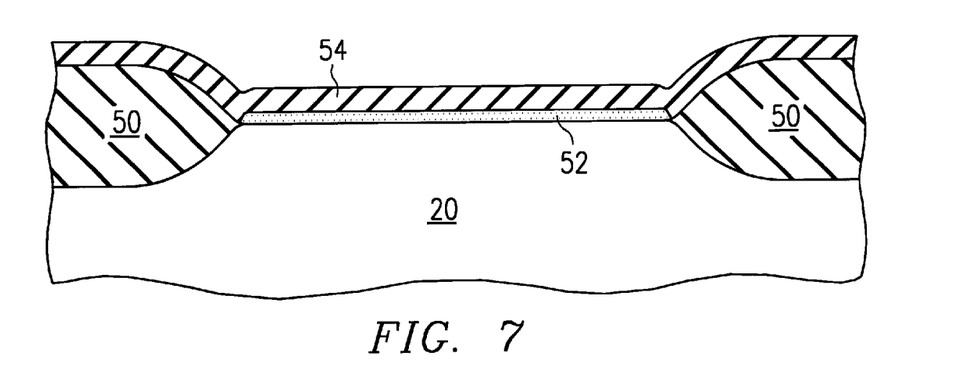

The germanium layer 52 provides a very flat face on which to deposit the large-permittivity gate dielectric, as shown in FIG. 7. This is contrasted with the relatively rough Si—$SiO_2$ interface formed in prior art gates. A very flat interface becomes increasingly important as the thickness of layers decreases (e.g., a 1.5 nm germanium layer is only about 5 monolayers deep). Tantalum pentoxide layer 54 is deposited at about 410° C. in an $H_2O_2/H_2$—$O_2$ ambient, to a physical thickness of 10 nm, which yields an effective (electrical) thickness of about 2 nm. The deposition is performed at a low temperature and in such an ambient that the germanium is subject to reduction. In addition, the temperature and heating time are kept lower and shorter than would cause the intermixing of the silicon layer 20 and germanium layer 52. Typically, the temperature should be kept to less than 550° C. Other acceptable ambient environments for the gate dielectric deposition include $CO_2/CO$—$O_2$, $N_2O/N_2$—$O_2$, vacuum, $N_2$, and Ar. Because germanium has a much smaller free energy of oxidation than silicon, germanium layer 52 is not oxidized, and also prevents oxidation of underlying silicon semiconductor 20. It thus prevents the formation of a low dielectric constant layer between the large-permittivity gate dielectric and the underlying semiconductor. Note that a physically thicker large-permittivity gate dielectric may be used and still give a low equivalent or effective oxide (silicon dioxide) thickness -compared to the prior art, because an interfacial oxide layer is prevented from being formed. Thus a large-permittivity dielectric layer may be made 5 or 10 nm thick or more, and still give an equivalent oxide thickness of less than 2 or 3 nm.

In order to improve the performance of the gate dielectric material, tantalum pentoxide layer 54 is annealed for 30 minutes at 400° C. in an oxygen ambient. This annealing will reduce the leakage current of the dielectric by substantially completely oxidizing the tantalum pentoxide layer 54, while at the same time remaining at a temperature/time profile that does not affect the germanium layer 52 or silicon layer 54. A rapid thermal anneal (RTA) at 700° C. for 1 minute in an $O_2$ or $N_2$ ambient, or an oxygen plasma anneal could also be used to perform this function. As in the deposition step, the germanium layer 52 prevents oxidation of the underlying silicon layer 20, and thus prevents the formation of a low dielectric constant layer which would significantly reduce the effective capacitance of the gate dielectric.

Figure 8:
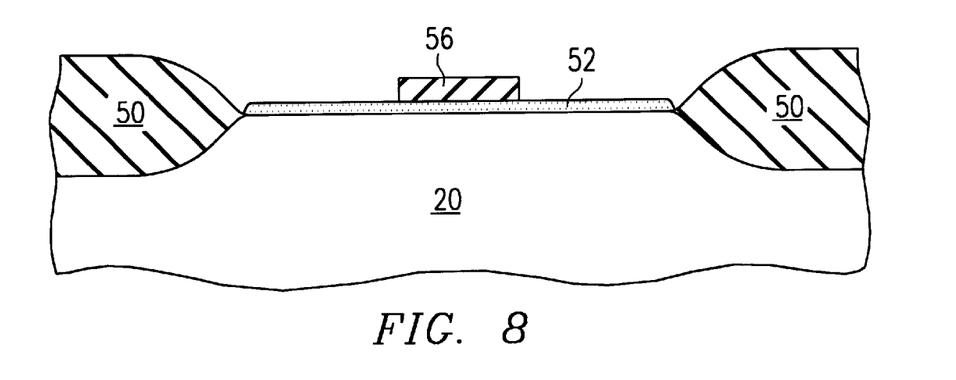

As shown in FIG. 8, tantalum pentoxide layer 54 is patterned with standard removal or resist techniques to form tantalum pentoxide gate dielectric 56. This large-permittivity gate dielectric overlies that part of the semiconductor which will form the channel region of the MISFET. The remaining components of a standard MISFET may now be added, including a source and drain, and a gate electrode. The portion of the germanium layer 52 underlying gate dielectric 56 forms part of the channel region between the source and drain. Advantageously, germanium has a higher hole mobility (about 3–4 times) and a higher electron mobility (about 2 times) than that of silicon, and thus can improve the performance of both PMOS and NMOS FETs (e.g., by increasing speed).

Figure 9:
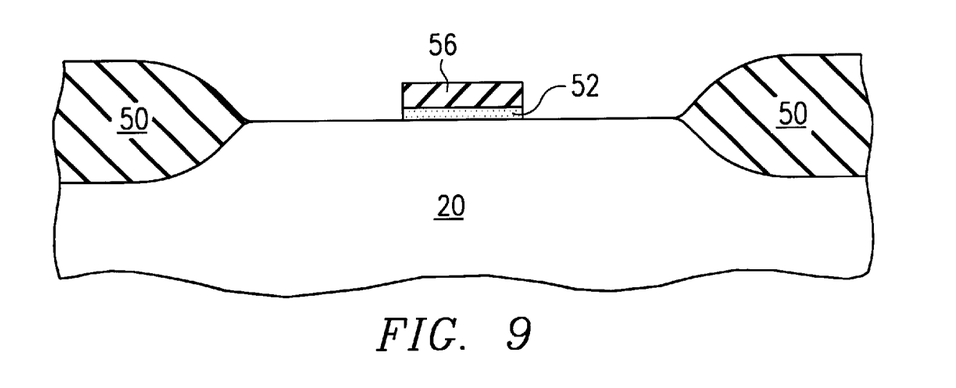
FIGS. 9–10 show cross-sections of alternate embodiments of a field-effect transistor using an epitaxial Ge buffer layer.
Figure 10:
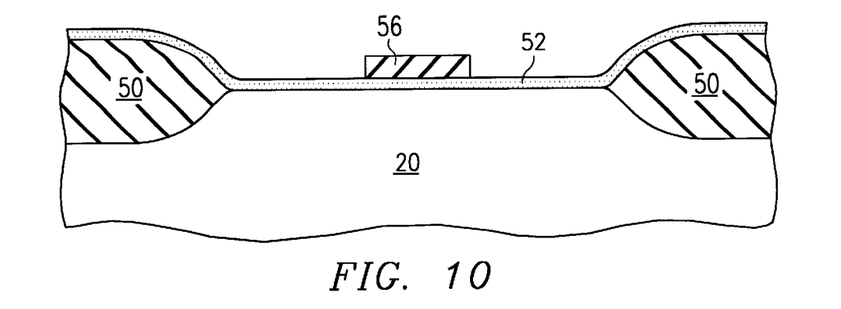

In this embodiment, shown in FIG. 8, germanium layer 52 extends over the source and drain regions, and can be used part of those regions also. In contrast, FIG. 9 illustrates an alternate embodiment in which the germanium layer 52 is located only under the gate dielectric 56. This structure can be formed either by selectively depositing the germanium only on the surface of the silicon substrate 20 in the gate region, or by forming the germanium layer as shown in FIG. 5 and subsequently removing the germanium outside of the gate region. FIG. 10 illustrates yet another embodiment wherein germanium layer 52 is formed on both the exposed silicon substrate surface and on the field oxide surface. Generally, the germanium layer 52 is only epitaxial over the exposed surface of the silicon substrate 20, and it is polycrystalline over the field oxide 50. Preferably the germanium is removed from the field oxide surface before completion of the integrated circuit.

Figure 11:
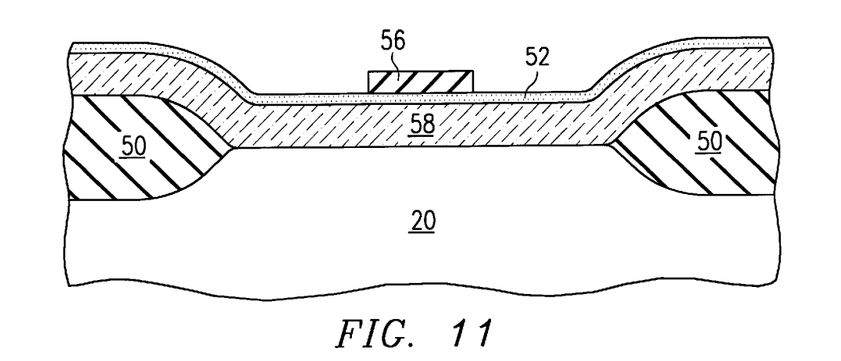
FIG. 11 shows a cross-section of an alternate embodiment of a field-effect transistor using an epitaxial Si/Ge buffer layer and an epitaxial Ge layer.

FIG. 11 shows another alternate embodiment with the addition of a new layer between the germanium layer 52 and the substrate 20. In this embodiment, both germanium and silicon sources are used as precursors to grow a $Ge_xSi_{1-x}$ gradient buffer layer 58 on the silicon substrate 20. As above, the $Ge_xSi_{1-x}$ buffer layer 58 is generally only epitaxial over the exposed surface of the silicon substrate 20. The value of x is continuously varied from about 0 near the surface of silicon substrate 20, up to about 1 at the interface with germanium layer 52. The thickness of gradient layer 58 is preferably about 0.5 um, and can improve the lattice matching between silicon substrate 20 and germanium layer 52. Subsequent processing can continue as discussed in the embodiments above. Alternatively, the $Ge_xSi_{1-x}$ buffer layer 58 may only be formed over the exposed surface of the silicon substrate 20.

Figure 12:
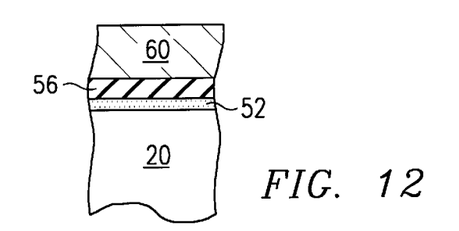
FIG. 12 shows a cross-section of an embodiment of a multi-layer structure using an epitaxial Ge buffer layer.

In FIG. 12, an arrangement of layers is shown which is usable as a portion of many structures used in semiconductor circuitry, especially MISFETs used in DRAMs. Germanium layer 52 is disposed on silicon layer 20, and provides a barrier to the oxidation of the silicon during subsequent processing steps. Tantalum pentoxide layer 56 is disposed on germanium layer 52, and functions as a large-permittivity gate dielectric. Finally, gate electrode 60 is disposed on tantalum pentoxide layer 56. A metal containing layer, such as titanium nitride or tungsten, is preferably used for gate electrode 60 because of the underlying oxygen-rich tantalum pentoxide layer 56.

Figure 13:
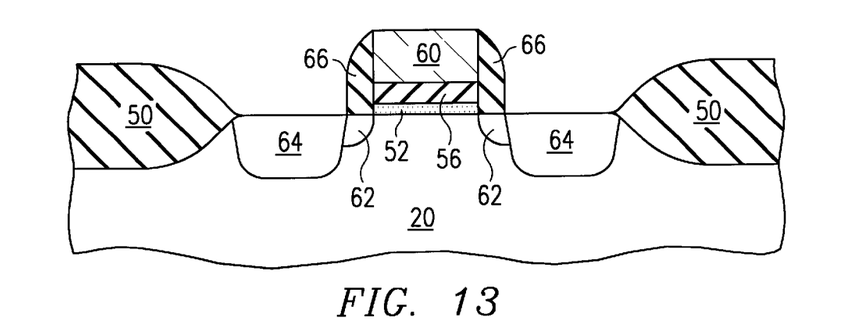
FIG. 13 shows a cross-section of an alternate embodiment of a field-effect transistor using an epitaxial Ge buffer layer.

FIG. 13 shows a substantially complete MISFET utilizing the present invention. Layers 20, 50, 52, 56, and 60 are essentially the same as discussed in the embodiments above. As an NMOS transistor, p-type silicon substrate 20 contains n+source and drain regions 64. The channel region is located under large-permittivity gate dielectric 56, and includes germanium layer 52. Note that germanium layer 52 could alternatively extend out to the field oxide 50 boundaries, and thus form part of the source and drain regions 64. The transistor also includes sidewall spacers 66 and lightly doped regions 62. Those skilled in the art will recognize that these and other features may be used or left out, depending upon the particular function of the device and the intended processing flow.

While the interactions of silicon and germanium have been extensively studied, this is apparently the first time that a germanium buffer layer has been used in conjunction with a large-permittivity gate dielectric. Also, while a number of materials have been previously been suggested for use next to large-permittivity materials, none of these materials provides for the epitaxial growth of large-permittivity materials on a conductor or semiconductor. Further, when used next to the silicon substrate, the prior art materials generally either form a silicide (e.g. of palladium, platinum or titanium) which allows the diffusion of silicon into the large-permittivity materials, or react with silicon (e.g. tin dioxide), or the prior art materials generally react with the large permittivity material to form low dielectric constant insulators (e.g. titanium monoxide or tantalum pentoxide). Thus the prior art materials suggested for interfacing large-permittivity oxides with semiconductors either have reacted with the large-permittivity oxides or with the semiconductor and/or have not provided a diffusion barrier between the large-permittivity oxides and semiconductor material. At the deposition and annealing temperatures necessary to produce good quality large-permittivity oxide material, such reactions generally form low dielectric constant insulators, which being in series with the large-permittivity oxide material, dramatically lowers the effective dielectric constant. Only germanium (doped or undoped) gives a conductor or semiconductor which reacts neither with the semiconductor substrate nor the large-permittivity oxide at the required deposition and annealing temperatures, and only germanium provides for epitaxial growth of a conductive or semiconductive material on a semiconductor substrate, in a matter compatible with growing and annealing of a large-permittivity oxide in a non-reactive manner, such that a metal oxide metal or metal oxide semiconductor structure can be fabricated without the effective dielectric constant being significantly lowered by a low dielectric constant material between the large-permittivity material and the underlying conductor or semiconductor.

Since various modifications of the semiconductor structure (e.g. silicon or gallium arsenide), and the methods of fabrication thereof, are undoubtedly possible by those skilled in the art without departing from the scope of the invention, the detailed description is thus to be considered illustrative and not restrictive of the invention as claimed hereinbelow. It is intended that the present invention encompass such modifications as fall within the scope of the appended claims.

For example, parts of the discussion have generally used the term "ferroelectric" materials, however, the invention is generally applicable to any "large-permittivity oxide" and some such materials are not ferroelectric and some not titanates. As used herein, the term "large-permittivity" oxides or dielectrics means oxides or dielectrics with dielectric constants of greater than about 6, preferably greater than about 8, and most preferably greater than about 20, at device operating temperature. Large-permittivity oxides comprise both moderate-dielectric constant oxides and high-dielectric constant oxides. The term "moderate-dielectric constant" oxides or dielectrics as used herein means oxides or dielectrics with dielectric constants of between about 6 and 100, more preferably between about 8 and 100, and most preferably between about 20 and 100. The term "high-dielectric constant" oxides or dielectrics as used herein means oxides or dielectrics with dielectric constants of greater than 100, and preferably greater than 1,000 (e.g., barium strontium titanate can have dielectric constants greater than 10,000). Many high-dielectric constant oxides can be considered to be based on $BaTiO_3$ and include oxides of the general formula $(Ba,Sr,Ca)(Ti,Zr,Hf)O_3$. Many other oxides are of the general formula $(K,Na,Li)(Ta,Nb)O_3$ and still other oxides such as $(Pb,La)ZrTiO_3$ or $(Pb,Mg)NbO_3$ or $Bi_4Ti_3O_{12}$ will also work. The oxides can also be doped with acceptors such as Al, Mg, Mn, or Na, or donors such as La, Nb, or P. Other examples include the layered perovskite family of materials, for example, $Bi_2A_{1-x}B_xO_{3x-3}$, where A is Ba, Sr, Ca, Pb, or Ga, and B is Ti, Ta. Zr, or Nb. High-dielectric constant oxides, however, may prove to be too difficult to work with at least in the near term, and the more accepted and process-friendly oxides such as moderate-dielectric constant oxides may be preferred.

As another example, while the invention is described primarily with respect to DRAM's, other devices, such as EPROMs, video RAMs, other multiport RAMs, and many other semiconductor devices, can benefit from the present invention. Other non-germanium semiconductors can also be used in addition to silicon and gallium arsenide. As used herein, the term "semiconductor" is used to mean "non-germanium semiconductor". While the invention may have been specifically described with respect to NMOS or PMOS devices, the given polarities in a device may be reversed to convert, e.g., an NMOS device into a PMOS device. The invention is equally applicable to CMOS devices, and to devices operated in enhancement mode or depletion mode as well. The source and drain regions may also be reversed in a MISFET device. There may be p or n wells provided in a substrate in which to form a device using the present invention. The device may be formed with self-aligned techniques or otherwise. The underlying semiconductor may be bulk or a silicon-on-oxide (SOI) region.

What is claimed is:

1. A method of forming a MIS field-effect transistor in an integrated circuit, said method comprising:

forming a germanium layer on a semiconductor substrate;

depositing a large-permittivity gate dielectric on said germanium layer, whereby said germanium layer prevents formation of a low dielectric constant layer between said gate dielectric and said substrate;

forming source and drain regions in said substrate on either side of said gate dielectric, wherein said germanium layer extends across and is part of said source or said drain region; and forming a gate electrode on said gate dielectric.

2. The method of claim 1, wherein said germanium layer is part of a channel region of said MIS field-effect transistor between said source and drain regions.

3. The method of claim 1, wherein said germanium layer is epitaxially grown on said semiconductor substrate.

4. The method of claim 1, wherein said substrate is silicon.

5. The method of claim 3, wherein said large-permittivity dielectric is epitaxially grown on said germanium layer.

6. The method of claim 1, wherein said large-permittivity gate dielectric is a high-dielectric constant oxide.

7. The method of claim 1, wherein said large-permittivity gate dielectric is a moderate-dielectric constant oxide.

8. The method of claim 1, wherein said large-permittivity gate dielectric is a tantalum pentoxide.

9. The method of claim 1, wherein said large-permittivity gate dielectric is an oxide of a material selected from the group consisting of: Al, Ti, Zr, Hf, Ce, Sc, Y, La, Ta, Nb, and combinations thereof.

10. The method of claim 1, wherein said germanium layer is less than 2 nm thick

11. The method of claim 1, wherein said germanium layer is about 1.5 nm thick.

12. The method of claim 1, wherein said gate dielectric has an effective electrical thickness of less than 3 nm.

13. The method of claim 1 further comprising annealing said gate dielectric after forming said gate dielectric on said germanium layer.

14. The method of claim 1 further comprising forming a $Ge_xSi_{1-x}$ buffer layer between said semiconductor substrate and said germanium layer, wherein x transitions from about 0 near said substrate to about 1 near said germanium layer.

15. The method of claim 13, wherein said $Ge_xSi_{1-x}$ buffer layer is about 0.5 um thick.

16. The method of claim 1, wherein said transistor is part of a CMOS device.

17. The method of claim 1, wherein said integrated circuit is a DRAM.

18. A method of forming a MIS field-effect transistor in an integrated circuit, said method comprising:

epitaxially growing a germanium layer less than 2 nm thick on a silicon substrate;

epitaxially growing a large-permittivity gate dielectric less than 2 nm thick on said germanium layer;

annealing said gate dielectric;

forming a gate electrode on said gate dielectric; and forming source and drain regions in said substrate on either side of said gate dielectric.

19. A method of forming a MIS field-effect transistor in an integrated circuit with a semiconductor substrate, said method comprising:

forming a $Ge_xSi_{1-x}$ buffer layer on said semiconductor substrate, wherein x transitions from about 0 near said semiconductor substrate to about 1 remote from said semiconductor substrate;

forming a germanium layer on the buffer layer;

depositing a large-permittivity gate dielectric on said germanium layer;

forming a gate electrode on said gate dielectric.

20. The method of claim 18, wherein said $Ge_xSi_{1-x}$ buffer layer is about 0.5 um thick.

* * * * *

UNITED STATES PATENT AND TRADEMARK OFFICE
CERTIFICATE OF CORRECTION

PATENT NO. : 6,287,903 B1
DATED : September 11, 2001
INVENTOR(S) : Yasutoshi Okuno, Scott R. Summerfelt It is certified that error appears in the above-identified patent and that said Letters Patent is hereby corrected as shown below:

Title page,
Item [60], Continuing Data, add "Provisional application No. 60/068,729, December 24, 1997."

Column 1,
Between lines 1 and 2, add -- This application claims priority under 35 U.S.C. § 119(e)(1) of provisional application number 60/068,729 filed 12/24/97. --

Signed and Sealed this

Fifth Day of March, 2002

Attest:

JAMES E. ROGAN
*Director of the United States Patent and Trademark Office*

*Attesting Officer*